US009852069B2

(12) United States Patent
Crossland et al.

(10) Patent No.: US 9,852,069 B2
(45) Date of Patent: Dec. 26, 2017

(54) RAM DISK USING NON-VOLATILE RANDOM ACCESS MEMORY

(71) Applicant: Intel Corporation, Santa Clara, CA (US)

(72) Inventors: James B. Crossland, Banks, OR (US); Toby Opferman, Beaverton, OR (US); Blaise Fanning, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/357,509

(22) Filed: Nov. 21, 2016

(65) Prior Publication Data
US 2017/0139827 A1 May 18, 2017

Related U.S. Application Data

(63) Continuation of application No. 13/993,344, filed as application No. PCT/US2011/067829 on Dec. 29, 2011, now Pat. No. 9,535,827.

(51) Int. Cl.
*G06F 12/02* (2006.01)
*G06F 12/06* (2006.01)
(Continued)

(52) U.S. Cl.
CPC ........ *G06F 12/0638* (2013.01); *G06F 12/023* (2013.01); *G06F 12/0238* (2013.01);
(Continued)

(58) Field of Classification Search
CPC ...... G06F 3/064; G06F 3/0641; G06F 3/0644; G06F 11/1453; G06F 12/023;
(Continued)

(56) References Cited

U.S. PATENT DOCUMENTS 5,359,713 A * 10/1994 Moran .................. G06F 13/102
706/925
5,430,858 A *  7/1995 Greeley ................ G06F 3/0601
711/217

(Continued)

FOREIGN PATENT DOCUMENTS

CN          1215864 A      5/1999
WO      2013101053 A1     7/2013

OTHER PUBLICATIONS

Notice of Allowance received for Taiwanese Patent Application No. 101150581, dated Dec. 19, 2016, 3 pages including 1 page of English translation.

(Continued)

*Primary Examiner* — Mano Padmanabhan
*Assistant Examiner* — William E Baughman
(74) *Attorney, Agent, or Firm* — Compass IP Law PC

(57) ABSTRACT

A method and system are disclosed. In one embodiment the method includes allocating several memory locations within a phase change memory and switch (PCMS) memory to be utilized as a Random Access Memory (RAM) Disk. The RAM Disk is created for use by a software application running in a computer system. The method also includes mapping at least a portion of the allocated amount of PCMS memory to the software application address space. Finally, the method also grants the software application direct access to at least a portion of the allocated amount of the PCMS memory.

16 Claims, 6 Drawing Sheets

(51) Int. Cl.
*G11C 7/10* (2006.01)
*G11C 14/00* (2006.01)
*G06F 12/08* (2016.01)
*G06F 12/0866* (2016.01)
*G11C 13/00* (2006.01)

(52) U.S. Cl.
CPC ........ *G06F 12/0866* (2013.01); *G11C 7/1072* (2013.01); *G11C 14/0036* (2013.01); *G11C 14/0045* (2013.01); *G06F 2212/202* (2013.01); *G06F 2212/205* (2013.01); *G06F 2212/2024* (2013.01); *G11C 13/0004* (2013.01)

(58) Field of Classification Search
CPC ............. G06F 12/0238; G06F 12/0246; G06F 12/0292; G06F 12/06; G06F 12/0607; G06F 17/30156; G06F 2212/202; G06F 12/0866; G11C 13/0004
See application file for complete search history.

(56) References Cited

U.S. PATENT DOCUMENTS

| | | | |
|---|---|---|---|
| 6,032,223 A | | 2/2000 | Beelitz |
| 6,032,240 A | | 2/2000 | Brown |
| 7,249,241 B1 * | | 7/2007 | Chu .................... G06F 12/1081 710/22 |
| 8,966,188 B1 * | | 2/2015 | Bardale ................. G06F 12/109 711/104 |
| 2003/0070065 A1 * | | 4/2003 | Fleming ................ G06F 1/3203 713/2 |
| 2003/0233485 A1 * | | 12/2003 | Khan ...................... G06F 9/542 719/318 |
| 2004/0133602 A1 * | | 7/2004 | Kusters .................. G06F 3/061 |
| 2005/0097294 A1 * | | 5/2005 | Hepkin ................. G06F 9/4812 711/170 |
| 2005/0177635 A1 * | | 8/2005 | Schmidt .................... G06F 9/52 709/226 |
| 2006/0004946 A1 * | | 1/2006 | Shah ...................... G06F 13/28 711/100 |
| 2008/0097294 A1 | | 4/2008 | Prather et al. |
| 2009/0235102 A1 * | | 9/2009 | Koshika ............. G03G 15/5004 713/324 |
| 2010/0037005 A1 | | 2/2010 | Kim et al. |
| 2010/0318718 A1 | | 12/2010 | Eilert et al. |
| 2011/0107042 A1 * | | 5/2011 | Herron .................. G06F 3/0605 711/161 |
| 2011/0208900 A1 | | 8/2011 | Schuette et al. |

OTHER PUBLICATIONS

English Translation of Search Report of R.O.C. Patent Application No. 101150581, dated May 4, 2016, 1 page.
English Translation of State Intellectual Property Office, P.R. China, Notice of Allowance, Patent Application No. 201180076054.0, dated Sep. 2, 2016, 6 pages.
Final Office Action for U.S. Appl. No. 13/993,344, dated Oct. 1, 2015, 26 pages.
International Preliminary Report on Patentability received for PCT Patent Application No. PCT/US2011/067829, dated Jul. 10, 201, 6 pages.
International Search Report and Written Opinion received for PCT Patent Application No. PCT/US2011/067829, dated Aug. 30, 2010, 8 pages.
Notice of Allowance for U.S. Appl. No. 13/993,344, dated Nov. 23, 2016, 8 pages.
Office Action for U.S. Appl. No. 13/993,344, dated Jan. 28, 2015, 28 pages.
Office Action for U.S. Appl. No. 13/993,344, dated Mar. 31, 2016, 28 pages.
State Intellectual Property Office, P.R. China, "First Office Action," issued in connection with Chinese Patent Application No. 201180076054.0, dated Dec. 28, 2015, 7 pages.

* cited by examiner

RAM DISK USING NON-VOLATILE RANDOM ACCESS MEMORY

CROSS REFERENCE TO RELATED APPLICATIONS

This patent arises from a continuation of U.S. patent application Ser. No. 13/993,344, filed Jun. 12, 2013, now U.S. Pat. No. 9,535,827, which claims priority to PCT application PCT/US2011/067829 filed on Dec. 29, 2011. U.S. patent application Ser. No. 13/993,344 and PCT application PCT/US2011/067829 are hereby incorporated herein by reference in their entireties.

FIELD OF THE INVENTION

The invention relates to implementing a RAM Disk in non-volatile memory.

DESCRIPTION OF THE RELATED ART

Phase-Change Memory and Switch (PCMS) is a non-volatile storage technology under development as a successor to the NAND non-volatile storage ubiquitous in today's solid state storage devices. PCMS offers much higher performance than NAND flash and in fact begins to approach the performance points of the Dynamic Random Access Memory (DRAM) currently used as primary dynamic storage in most client computing devices. While PCMS storage may initially be more expensive per-bit than NAND storage, that relationship is forecasted to change over time until, eventually, PCMS is less expensive than NAND.

BRIEF DESCRIPTION OF THE DRAWINGS

The following description and accompanying drawings are used to illustrate embodiments of the invention. In the drawings.

DETAILED DESCRIPTION

Figure 1:
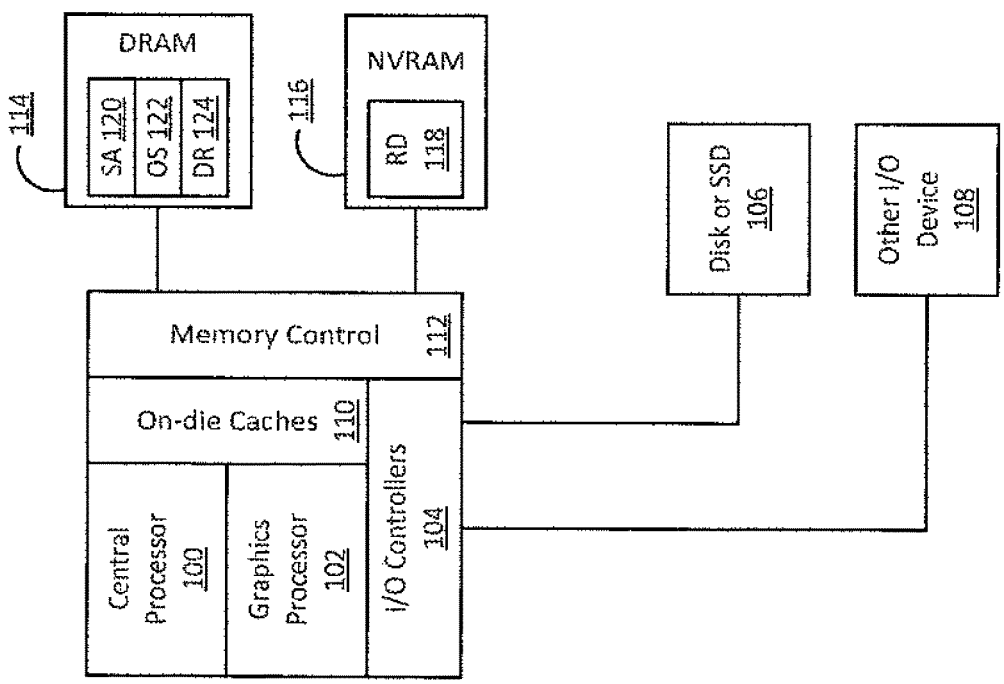
FIG. 1 illustrates an embodiment of a computer system that employs a NVRAM-based RAM Disk.

The combination of technologies such as PCMS non-volatile storage, with the decrease in the size and the increase in performance of transistors in integrated circuits, allows for software solutions that normally would be limited to volatile memories, to be applicable in non-volatile embodiments and especially beneficial as well. For example, a random access memory (RAM) Disk, which is normally implemented in volatile memory, would have extended benefits if implemented with a non-volatile memory technology. A RAM Disk is a block of memory that an operating system or software application, running on a computer system, treats as if the block were a mass storage disk (i.e., a hard drive, solid state drive, etc.). A RAM Disk is useful when a software application attempts to frequently access a mass storage disk. Since the RAM Disk is resident in memory, if the items being accessed are located on the RAM Disk instead of being located out on a real mass storage drive, the accesses can happen with much less latency. Additionally, when a RAM Disk is implemented in non-volatile memory, additional benefits may be realized, such as increasing the speed of power state transitions as well as increased security solutions for a computer system.

Thus, non-volatile memory/storage technologies increase the effectiveness of a given RAM Disk. There are many types of non-volatile storage, though according to many embodiments described, non-volatile random access memory (NVRAM) storage is utilized and is described in greater detail below.

1. Non-Volatile Random Access Memory Overview

There are many possible technology choices for NVRAM, including phase change memory (PCM), Phase Change Memory and Switch (PCMS) (the latter being a more specific implementation of the former), byte-addressable persistent memory (BPRAM), storage class memory (SCM), universal memory, Ge2Sb2Te5, programmable metallization cell (PMC), resistive memory (RRAM), RESET (amorphous) cell, SET (crystalline) cell, PCME, Ovshinsky memory, ferroelectric memory (also known as polymer memory and poly(N-vinylcarbazole)), ferromagnetic memory (also known as Spintronics, SPRAM (spin-transfer torque RAM)), STRAM (spin tunneling RAM), magnetoresistive memory, magnetic memory, magnetic random access memory (MRAM), and Semiconductor-oxide-nitride-oxide-semiconductor (SONOS, also known as dielectric memory).

NVRAM has the following characteristics:

It maintains its content even if power is removed, similar to FLASH memory used in solid state disks (SSD), and different from SRAM and DRAM which are volatile;

it may have lower overall power consumption than volatile memories such as SRAM and DRAM;

it may have random access similar to SRAM and DRAM (also known as randomly addressable);

it is rewritable and erasable at a lower level of granularity (e.g., byte level) than FLASH found in SSDs (which can only be rewritten and erased a "block" at a time-minimally 64 Kbyte in size for NOR FLASH and 16 Kbyte for NAND FLASH);

it can be used as a system memory and allocated all or a portion of the system memory address space;

it may be capable of being coupled to the CPU over a bus (also interchangeably referred to as an interconnect or link) using a transactional protocol (a protocol that supports transaction identifiers (IDs) to distinguish different transactions so that those transactions can complete out-of-order) and allowing access at a level of granularity small enough to support operation of the NVRAM as system memory (e.g., cache line size such as 64 or 128 byte). For example, the bus/interconnect may be a memory bus (e.g., a double data rate (DDR) bus such as DDR3, DDR4, etc.) over which is run a transactional protocol as opposed to the non-transactional protocol that is normally used. As another example, the bus may run over a bus that normally runs a transactional protocol (a native transactional protocol), such as a PCI express (PCIE) bus, desktop management interface (DMI) bus, or any other type of bus utilizing a transactional protocol and a small enough transaction payload size (e.g., cache line size such as 64 or 128 byte); and it also may have one or more of the following characteristics:

a faster write speed than non-volatile memory/storage technologies such as FLASH;

very high read speeds (faster than FLASH and near or equivalent to DRAM read speeds);

it can be directly writable (rather than requiring erasing (overwriting with 1s) before writing data like FLASH memory used in SSDs); and/or a greater number of writes before failure (more than boot ROM and FLASH used in SSDs).

As mentioned above, in contrast to FLASH memory, which must be rewritten and erased a complete "block" at a time, the level of granularity at which NVRAM is accessed in any given implementation may depend on the particular memory controller and the particular memory bus or other type of bus to which the NVRAM is coupled. For example, in some implementations where NVRAM is used as system memory, the NVRAM may be accessed at the granularity of a cache line (e.g., a 64-byte or 128-Byte cache line), notwithstanding an inherent ability to be accessed at the granularity of a byte, because cache line is the level at which the memory subsystem accesses memory. Thus, in some embodiments, when NVRAM is deployed within a memory subsystem, it may be accessed at the same level of granularity as DRAM used in the same memory subsystem. Even so, in some embodiments, the level of granularity of access to the NVRAM by the memory controller and memory bus or other type of bus is smaller than that of the block size used by Flash and the access size of the I/O subsystem's controller and bus.

NVRAM may also incorporate wear leveling algorithms to account for the fact that the storage cells begin to wear out after a number of write accesses, especially where a significant number of writes may occur such as in a system memory implementation. Since high cycle count blocks are most likely to wear out in this manner, wear leveling spreads writes across the far memory cells by swapping addresses of high cycle count blocks with low cycle count blocks. Note that most address swapping is typically transparent to application programs because it is handled by hardware, lower-level software (e.g., a low level driver or operating system), or a combination of the two.

NVRAM is distinguishable from other instruction and data memory/storage technologies in terms of its characteristics and/or its application in the memory/storage hierarchy. For example, NVRAM is different from:

static random access memory (SRAM) which may be used for level 0 and level 1 internal processor caches dedicated to each core within a processor and lower level cache (LLC) shared by cores within a processor;

dynamic random access memory (DRAM) configured as a cache internal to a processor die (e.g., on the same die as the processor), configured as one or more caches external to a processor die (e. g., in the same or a different package than the processor die), or general system memory external to the processor package; and FLASH memory/magnetic disk/optical disc applied as mass storage; and memory such as FLASH memory or other read only memory (ROM) applied as firmware memory (which can refer to boot ROM, basic input/output system (BIOS) Flash, and/or trusted platform module (TPM) Flash).

NVRAM may be used as instruction and data storage that is directly addressable by a processor and is able to sufficiently keep pace with the processor in contrast to FLASH/magnetic disk/optical disc applied as mass storage. Direct addressability refers to a processor, such as a CPU or GPU, being able to send memory requests to the NVRAM as if it were standard DRAM (e.g., through standard memory store and load commands). Moreover, as discussed above and described in detail below, NVRAM may be placed on a memory bus and may communicate directly with a memory controller that, in turn, communicates directly with the processor.

NVRAM may be combined with other instruction and data storage technologies (e.g., DRAM) to form hybrid memories (also known as Co-locating PCM and DRAM; first level memory and second level memory; FLAM (FLASH and DRAM)). Note that at least some of the above technologies, including PCM/PCMS may be used for mass storage instead of, or in addition to, system memory, and need not be random accessible, byte addressable or directly addressable by the processor when applied in this manner.

For convenience of explanation, most of the remainder of the application will refer to "NVRAM" or, more specifically, "PCM," or "PCMS" as the technology selection for the non-volatile memory. As such, the terms NVRAM, PCM, and PCMS may be used interchangeably in the following discussion. However it should be realized, as discussed above, that different technologies may also be utilized.

2. NVRAM-based RAM Disk

FIG. 1 illustrates an embodiment of a computer system that employs a NVRAM-based RAM Disk. The computer system in FIG. 1 includes:

One or more central/general processors (CPUs) (100).

One or more graphics processors (102). In many embodiments, each of the one or more graphics processors may include one or more cores. Each core having internal units such as a vector unit, a texture unit, a rasterization unit, among others.

One or more intput/output (I/O) controllers and their associated I0 devices (104), such as disk or solid state drive (SSD) (106) and other input/output (I/O) device (108).

On-die caches (110) that are meant to insulate the central processor and optionally the graphics processors from the relatively slow DRAM memory.

A memory controller (112) that is designed to schedule DRAM commands optimally for bandwidth and/or latency, depending upon the system requirements at the time.

One or more groups of DRAM storage (114), arranged typically as 64-bit channels. In different embodiments, DRAM storage 114 may include synchronous DRAM (SDRAM), double data rate (DDR) SDRAM, DDR2, DDR3, DDR4, among others. Low-end computing devices might have a single channel, while high-end computing devices might have two or three DRAM channels.

One or more groups of NVRAM storage (116). Many different embodiments of NVRAM storage are described above.

In many embodiments, each of the one or more central processors may include one or more cores. Although not shown, each core may internally include one or more instruction/data caches, execution units, prefetch buffers, instruction queues, branch address calculation units, instruction decoders, floating point units, retirement units, etc.

The one or more I/O controller(s) are present to translate a host communication protocol utilized by the central processor(s) to a protocol compatible with particular I/O devices. Some of the protocols that adapters may be utilized for translation include Peripheral Component Interconnect (PCI)-Express (PCI-E), 3.0; Universal Serial Bus (USB), 3.0; Serial Advanced Technology Attachment (SATA), 3.0; Small Computer System Interface (SCSI), Ultra-640; and Institute of Electrical and Electronics Engineers (IEEE) 1394"Firewire;" among others.

There may also be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

Although not shown, a Basic Input/Output System (BIOS) flash device may additionally be present in the system and coupled through an I/O controller to provide a set of boot instructions when the system powers on or reboots. For BIOS flash device, some of the protocols that I/O controllers may translate include Serial Peripheral Interface (SPI), Microwire, among others.

Additionally, FIG. 1 includes a RAM Disk (RD) 118 present in the NVRAM. As discussed above, the RAM Disk 118 is a block of memory (i.e., a range of memory, a region of memory, etc.) that an operating system or software application, running on the computer system, treats as if the block were a mass storage disk (i.e., a hard drive, solid state drive, etc.). A RAM Disk 118 is useful when a software application attempt to frequently cause mass storage disk accesses. Since the RAM Disk 118 is resident in memory, if the items being stored are located on the RAM Disk 118 instead of being located out on a real mass storage drive, the accesses can happen with much less latency.

Normally a RAM Disk 118 is present in a DRAM or similar type of memory. In the embodiment illustrated in FIG. 1, the RAM Disk 118 is present in NVRAM. Thus, in these embodiments, the RAM Disk 118 is capable of storing the RAM Disk 118 through low power or no power being supplied to the NVRAM.

In many embodiments, RAM Disks are accessed through a software application's designated address space. In other words, when a software application (SA 120) is loaded into memory (DRAM 114), an operating system (OS 122) running on the computer system may allocate a region of logical address space, which the operating system manages, to the software application to operate within. The operating system may employ a specialized driver (DR 124) to provide access to address translation tables to get from logical address space (i.e., the space an operating system uses for normal operations) and physical address space.

Thus, the operating system may provide to the software application an address range to use for the RAM Disk. In many embodiments, this address range, after translating from logical to physical space, is physically located in NVRAM instead of normal DRAM.

Figure 2:
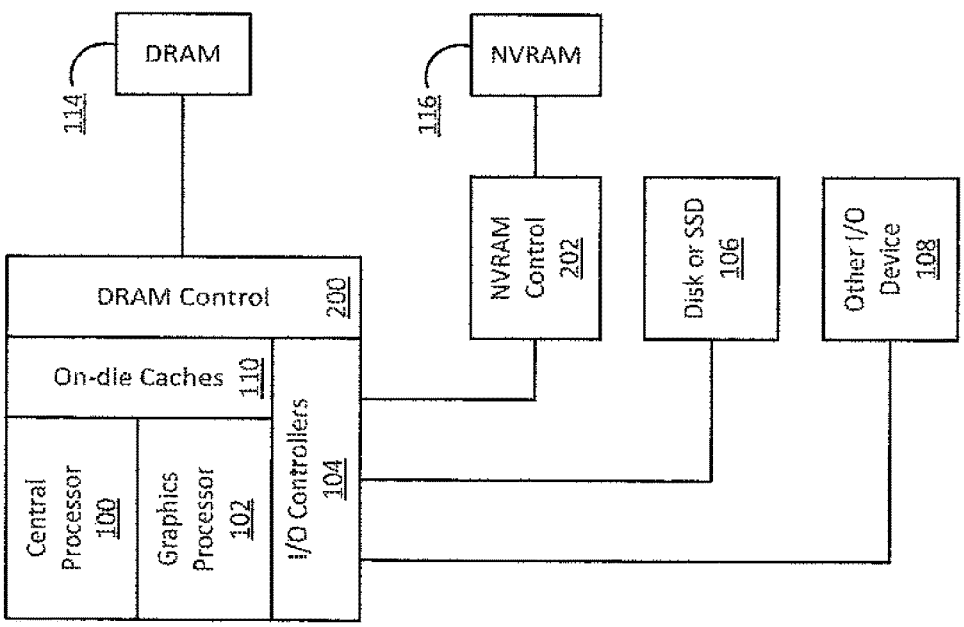
FIG. 2 illustrates an embodiment of a computer system with an alternate memory subsystem topology.

In FIG. 1, memory control 112 is a combined memory controller for DRAM 114 as well as NVRAM 116. Though, there are other configurations for the memory subsystem. For example, FIG. 2 illustrates an embodiment of a computer system with an alternate memory subsystem topology. In FIG. 2, there is a separate DRAM control 200, coupled to the central processor 100, which controls DRAM 114. Additionally, NVRAM control 202, controlling NVRAM 116, which is coupled to the central processor through an I/O controller 104.

Figure 3:
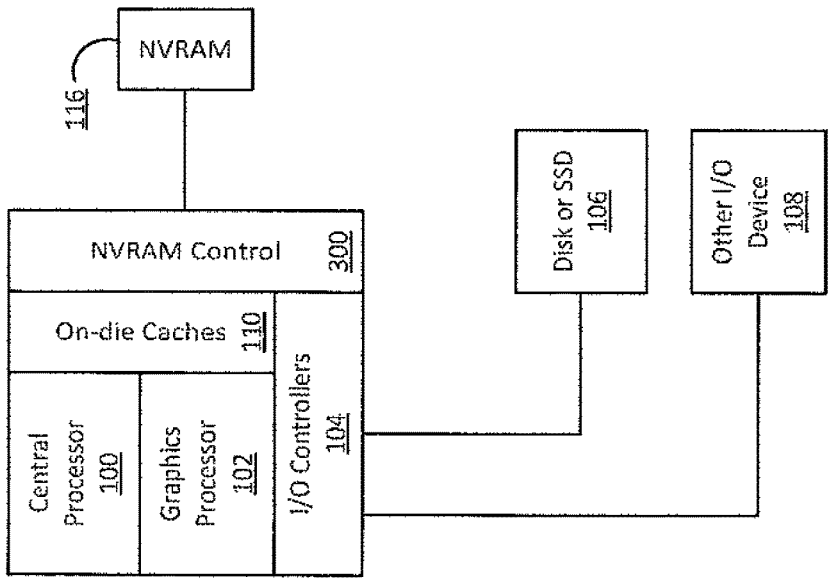
FIG. 3 is an embodiment of another alternate memory subsystem topology

Another example of an alternate memory subsystem topology is illustrated in FIG. 3. In FIG. 3, the NVRAM control 112 is potentially integrated into the same semiconductor package as the central processor 100. In this embodiment there is no DRAM and instead, the on-die caches 110 may be expanded to provide the operating system a large enough volatile memory space for adequate operations. Additionally, in this embodiment, NVRAM may be utilized a substantial amount for main memory operations.

The NVRAM-based RAM Disk may be utilized for many applications. For example, in some embodiments, there may be DRAM-to-NVRAM (memory-to-memory) DMA transfers that utilize the RAM Disk as a quick method for powering down the computer system into a low power state.

In both FIG. 2 and FIG. 3, the software application, driver, operating system, and mapping tables that were shown in FIG. 1 are present but are not shown explicitly.

Figure 4:
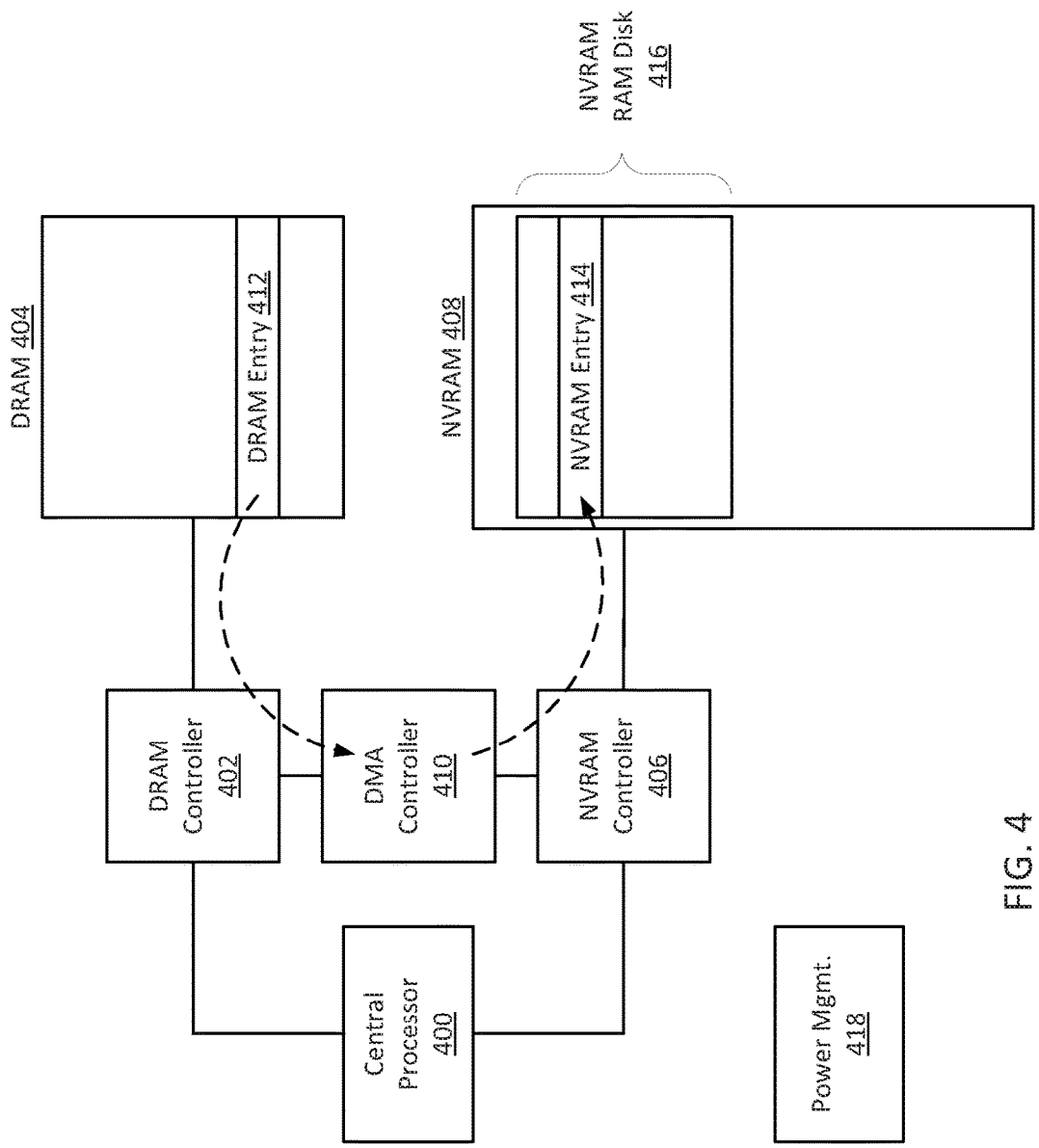
FIG. 4 illustrates an embodiment of a DMA controller-based DRAM-to-NVRAM transfer system.

FIG. 4 illustrates an embodiment of a DMA controller-based DRAM-to-NVRAM transfer system.

In FIG. 4, a central processor 400 is coupled to a DRAM controller 402 that controls transfers to and from a DRAM 404 and coupled to a NVRAM controller 406 that controls transfers to and from a NVRAM 408. Additionally, a DMA controller 410 is also coupled to the DRAM and NVRAM controllers. The DMA controller can transfer DRAM entries, such as entry 412, to NVRAM entries, such as entry 414. An operating system may use these NVRAM entries to set up a RAM Disk 416. The DMA controller 410 can operate independently from the central processor 400, which allows for the central processor to power down to a low power state. Power management logic 418 may monitor inbound and outbound central processor traffic and allow the central processor to enter a low power state when the DMA controller 418 is performing the transfers and transfers to and from the central processor 400 enter a quiescent state.

Additionally, because the RAM Disk 416 is non-volatile, the operating system may cause the DMA controller 410 to quickly perform a quick DMA copy of any key processor state variables to the RAM Disk 416, which are normally stored within DRAM 404 to allow for a powering down of the DRAM 404 to a low power state for additional power savings during idle times. These transfers may increase the speed of entering or exiting a low power state since information can be stored in NVRAM 408 and then quickly returned to DRAM 404 when the DRAM powers back up to an operational state. There would be no need to perform I/O transfers out to a mass storage device to save the state of the system, and instead the system state data would simply be transferred to the NVRAM RAM Disk 416.

Figure 5:
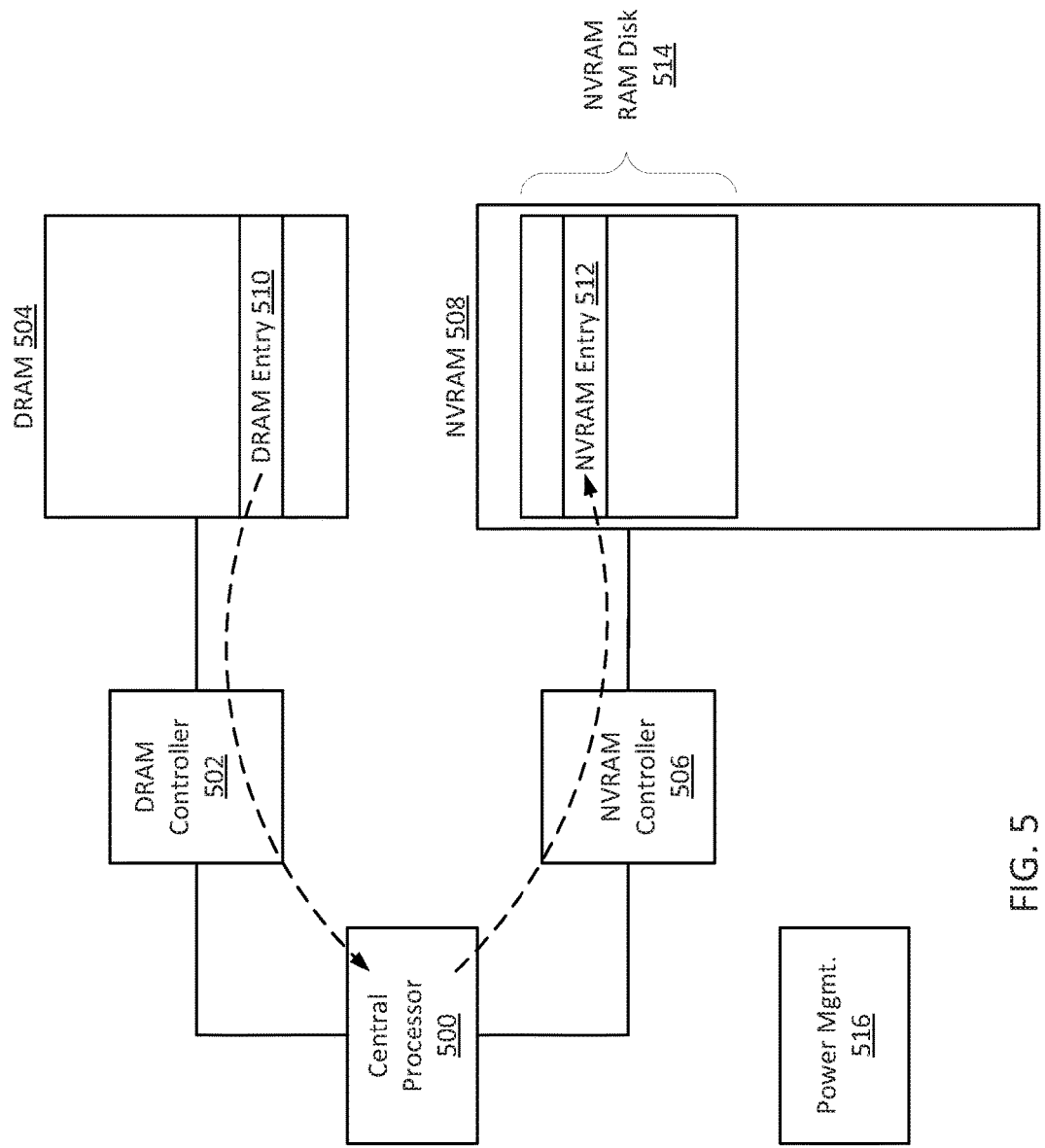
FIG. 5 illustrates another embodiment of a DRAM-to-NVRAM RAM Disk transfer system.

FIG. 5 illustrates another embodiment of a DRAM-to-NVRAM RAM Disk transfer system. In FIG. 5, a central processor 500 is coupled to a DRAM controller 502 that controls transfers to and from a DRAM 504 and coupled to a NVRAM controller 506 that controls transfers to and from a NVRAM 508. In this embodiment, the central processor can directly perform the transfer of DRAM entries, such as entry 510, to NVRAM entries, such as entry 512. Again, an operating system may use these NVRAM entries to set up a RAM Disk 514. Power management logic 516 may monitor inbound and outbound central processor traffic and allow the central processor 500 to enter a low power state when the transfers enter a quiescent state. Additionally, power management logic 516 also may put the entire system in a low power state if all necessary state variables are stored in the NVRAM RAM Disk 514.

Figure 6:
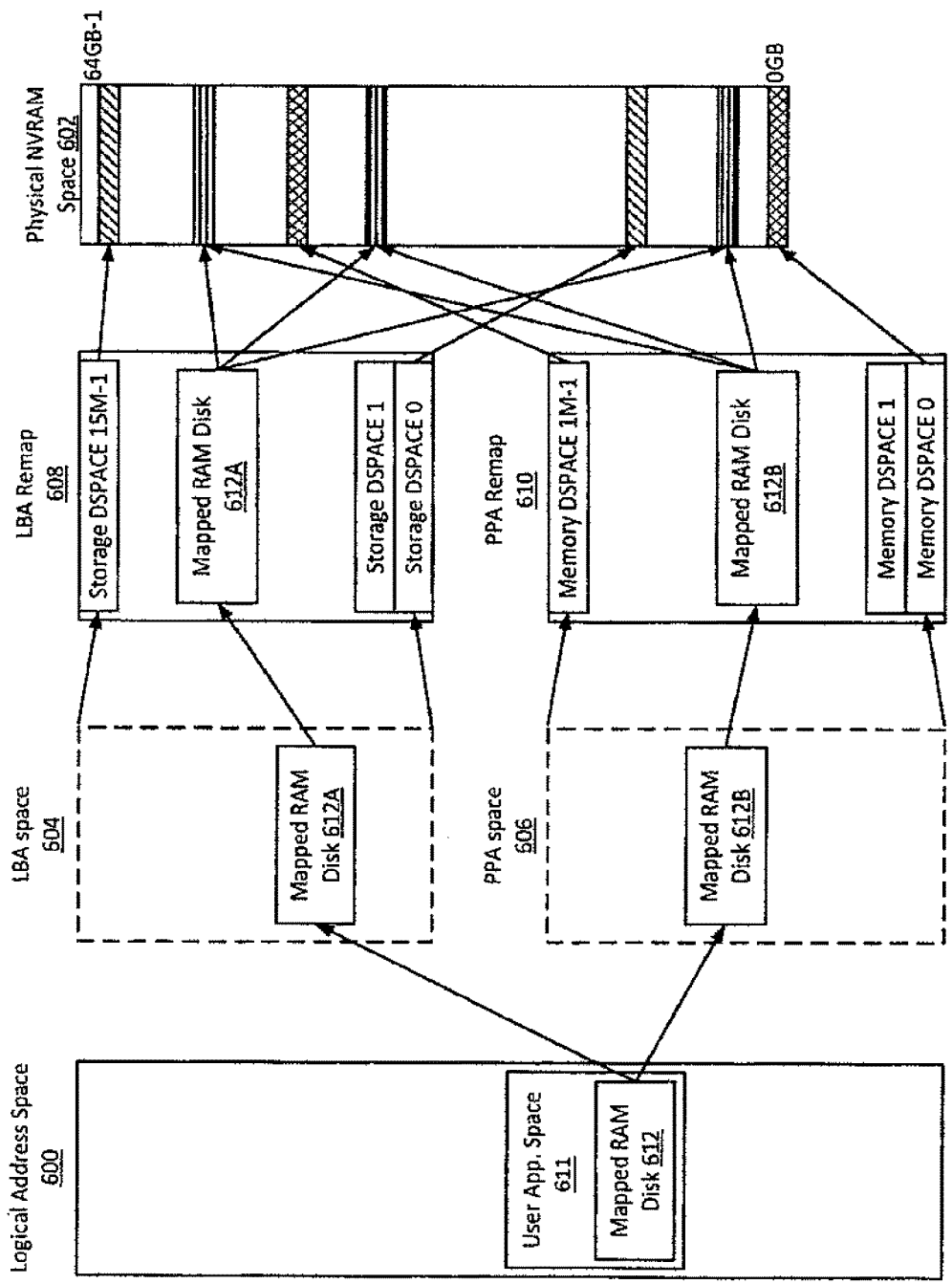
FIG. 6 illustrates an embodiment of a NVRAM RAM Disk being mapped into software application address space.

In other embodiments, an operating system running on the computer system may allow the pages of the NVRAM RAM Disk to be mapped directly into a user application's address space. FIG. 6 illustrates an embodiment of a NVRAM RAM Disk being mapped into software application address space.

An operating system running on the computer system has a logical address space 600 that is utilized as the functional address space for any resident software applications. The logical address space is mappable through address translation/redirection tables to physical NVRAM space 602. Logical address space can be translated to logical block address (LBA) space 604 or physical page address (PPA) space 606 in different embodiments, depending on how NVRAM is recognized. In some embodiments, portions of NVRAM are recognized as mass storage and portions are recognized as directly addressable memory. In FIG. 6, address redirection tables provide functionality for mapping page-granular PPAs and LBAs into ever-changing pages in the physical NVRAM devices. According to some embodiments, the remap tables 608 and 610 are located within an SRAM or other high-speed memory storage structure integrated within hardware control logic, in other embodiments, only the PPA remap table 610 is located in such a device and the LBA remap table 608 may be located out in physical NVRAM as well.

LBA space 604 is the space utilized by storage devices, such as mass storage devices. This space is organized by storage blocks and files are stored within the blocks. Generally, a storage driver, operating in conjunction with the operating system, initiates the logical address space 600 to LBA space 604 translations. In many embodiments, LBA space can then be utilized by a storage controller in the system to perform LBA block lookups in a mass storage device. Though, in the embodiment shown in FIG. 6, the LBA space 604 is at least partially translated through an LBA remap table 608 to physical NVRAM space 602. This LBA remap table 608 will perform an LBA space 604 lookup in the table and the result will be a physical location in the NVRAM. There are storage descriptors in the LBA remap table 608. In the embodiment shown in FIG.6, there are 15 million storage direct address space (DSPACE) entries in the LBA remap table 608 since each entry refers to a unique 4 KB page of LBA address space.

PPA space 606 is the space utilized by physical memory in the system. Though, in the embodiment shown in FIG. 6, PPA space 606 does not contain physical NVRAM address locations. Rather, the PPA space is remapped to physical NVRAM space 602 through LBA remap table 608.

In FIG. 6, there is a PPA remap table 700 that remaps a given PPA page address to a DSPACE address (an address referring to a specific physical page of NVRAM). The PPA remap table 610, in many embodiments, is stored as a single block of memory either in an SRAM integrated into the memory control logic or in the near memory (DRAM). For example, in a 4GB addressable PPA space, there are 1 million memory DSPACE entries in the PPA remap table 610 since each entry refers to a unique 4KB page of PPA address space. The memory remap table 610 is built from groups of remap descriptors (e.g., memory DSPACE 1 represented a stored descriptor in the PPA remap table 610. In many embodiments, there is one descriptor for each cacheline (e.g., 4K cacheline) of PPA space. The contents of a descriptor may vary based on different pieces of information that may need to be tracked. At least the NVRAM device address would be common to each descriptor embodiment, which would comprise a certain set of address bits in NVRAM device space corresponding to the PPA memory entry. This address would need to be in each descriptor to allow for the actual remapping procedure to take place.

Essentially, FIG. 6 illustrates a memory/storage subsystem for using a RAM Disk that is comprised of the following components:

A PPA remapping table 610 that creates a virtual or "phantom" space that emulates the traditional DRAM through a combination of a tiny amount of DRAM and an array of pointers into a physical memory portion of NVRAM space 602.

A LBA remapping table 608 that provides a translation from LBA address space to a physical storage portion of NVRAM space 602.

Hardware control logic (not shown), that allows software driver logic running in conjunction with the OS to manipulate pointers in the PPA remapping table 610 as well as pointers in the LBA remapping table 608.

A software driver running in the logical address space of the OS that uses the aforementioned hardware control logic to remap pointers between storage and memory portions of NVRAM instead of scheduling hardware-driven copies of data through interrupt requests and DMA transfers.

In some embodiments, there are separate software drivers utilized for manipulating the memory and storage portions of the remapping system. In other embodiments, there is one software driver that includes logic, such as software driver logic, that handles both remap tables.

As shown in FIG. 6, there is no specific reason to divide the NVRAM devices into storage and memory regions, so long as the complexity of mixing the two can be managed in a straightforward manner.

Once storage and memory have been located in the same physical device and their addresses intermingled, it becomes unnecessary to perform disk-related DMA operations in a traditional way—specifically it becomes unclear that data should be copied from one part of the NVRAM into another part.

Returning to the logical address space 600 controlled by the operating system, in many embodiments this space includes a user application space designated for a software application that is loaded into memory. Within this user/software application space 610, the operating system (and software driver performing the remapping duties of logical-to-physical address space) map the RAM Disk 612 (which is a set of addresses to be utilized for the purpose of a RAM Disk) for direct access and manipulation by the user software application. When the software application is loaded, it becomes a requestor of address space because it requests resources that are stored in DRAM and NVRAM.

Depending on the embodiment, either the RAM Disk functions within LBA space (612A) or within PPA space (612B). Thus, for an LBA implementation, the logical address space of the RAM disk is mapped to LBA space 604, and then translated through the LBA remap table 608 to get to the physical NVRAM locations of the RAM Disk, which may be scattered throughout the physical NVRAM space 602. For a PPA implementation, the logical address space of the RAM disk is mapped to PPA space 606, and then translated through the PPA remap table 610 to get to the physical NVRAM locations of the RAM Disk, which also may be scattered throughout the physical NVRAM space 602.

For files that are mapped into the users address space this is a natural fit. All changes to the file would be reflected back into the RAM-disk immediately, since those changes would be to the pages of the RAM-disk itself. In some embodiments, direct I/O could also allow the requestor direct access to the NVRAM pages. This may be applicable in any of the embodiments described in FIG. 1 through FIG. 3. If the allocated memory space area was mapped read-only nothing additional would be required. On the other hand, if the allocated memory space area was mapped read/write, the newly mapped NVRAM RAM Disk would have to be established with a copy-on-write usage model to prevent the modifications to the RAM Disk from being unintentionally reflected back to the original file. The copy-on-write usage model allows multiple requestors (i.e., user software applications) to be given pointers to a same resource (e.g., an entry in a given remap table). This can be maintained until one of the requestors actually attempts to modify the resource. At that point the requestor is given a private copy of the resource to keep other requestors from seeing the change.

The LBA remap table 608 and PPA remap table 610 have descriptors that are essentially translation lookaside buffer (TLB) entries. The page walks that map LBA and PPA space to physical NVRAM space have taken place. These entries are accessible by multiple requestors (e.g., multiple threads running on the operating system that are each allocated a certain address range in logical address space 600. Thus, the copy-on-write methodology works but there is a cost when a modification happens because the other requestors that did not modify the resource need to perform a TLB shoot-down (flush their copies) because they no longer have access to the previous version of the resource (since it has been modified).

The inherent cost of a TLB shoot-down associated with remapping address spaces may negate any savings of not performing a copy-on-write type of data copy. The directly mapped RAM Disk pages into a requestor's local memory space may be restricted to address spaces that have only a small number of threads active. In many embodiments, a requestor has a certain number of thread IDs associated with it, and this number may be compared against a maximum number of threads allowed for a requestor to obtain the direct-mapped NVRAM RAM Disk access. Management logic in the operating system may make a final determination as to which requestors are granted access rights to this type of RAM Disk. Additionally, operating system management logic may subsequently monitor a requestor's thread count after already having granted the requestor the right to utilize the NVRAM RAM Disk. Upon seeing too many additional threads being created by the monitored requestor, the operating system can either remove access to the NVRAM RAM Disk or block further thread creation.

This problem could also be mitigated by having a new type of I/O request either allocated or committed to the actual pages in the address space, since "not-present" to "present" transitions for page table entries do not require TLB shoot-downs.

Figure 7:
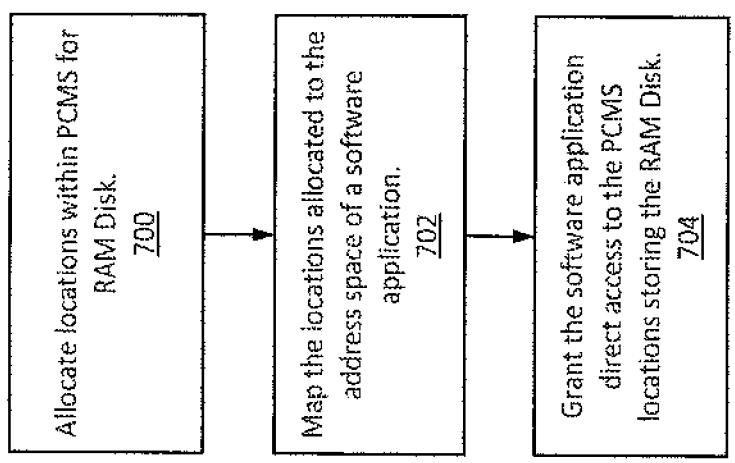
FIG. 7 is a flow diagram of an embodiment of a process to allocate a RAM Disk in PCMS memory space and map the RAM Disk directly into a software application's logical address space.

FIG. 7 is a flow diagram of an embodiment of a process to allocate a RAM Disk in PCMS memory space and map the RAM Disk directly into a software application's logical address space. The process may be performed by processing logic that comprises hardware, software, firmware, or a combination of two or more of the listed forms of processing logic. The process begins by processing logic allocating address space locations within a PCMS memory to be utilized as a RAM Disk (processing block 700). The RAM Disk may be allocated for the use of a software application that is running in a computer system.

Next processing logic maps at least a portion of the allocated amount of PCMS memory to the software application's logical address space (processing block 702). Finally, processing logic grants the software application direct access to the PCMS address locations that are storing the RAM Disk (processing block 704). When this grant happens, the software application has the ability to write to these mapped memory locations and directly affect a change to the data in the corresponding physical PCMS memory locations.

Figure 8:
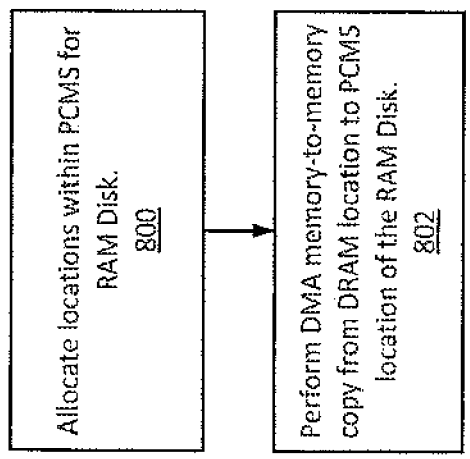
FIG. 8 is a flow diagram of an embodiment of a process to allocate a RAM Disk in PCMS memory space and perform DMA data transfers to the PCMS-based RAM Disk from DRAM memory.

FIG. 8 is a flow diagram of an embodiment of a process to allocate a RAM Disk in PCMS memory space and perform DMA data transfers to the PCMS-based RAM Disk from DRAM memory. The process may be performed by processing logic that comprises hardware, software, firmware, or a combination of two or more of the listed forms of processing logic. The process begins (similarly to the process above that is illustrated in FIG. 7) by processing logic allocating address space locations within a PCMS memory to be utilized as a RAM Disk (processing block 800).

Then processing logic performs DMA memory-to-memory copies from DRAM locations to PCMS locations where the RAM Disk resides (processing block 802). This processing logic may reside in a central processor in some embodiments or may reside in a DMA controller that has access to both DRAM and PCMS memory devices in other embodiments.

In the following description, numerous specific details such as logic implementations, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

Embodiments of the invention may also be provided as a computer program product which may include a non-transitory machine-readable medium having stored thereon instructions which may be used to program a computer (or other electronic device) to perform a process. The non-transitory machine-readable medium may include, but is not limited to, floppy diskettes, optical disks, CD-ROMs, and magneto-optical disks, ROMs, RAMs, EPROMs, EEPROMs, magnet or optical cards, propagation media or other type of media/machine-readable medium suitable for storing electronic instructions. Embodiments of the invention may also be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

We claim:

1. A method comprising:
   allocating first physical address locations of a byte-addressable, non-volatile memory for use by a software application as a random access memory (RAM) disk;
   allocating second physical address locations within the byte-addressable, non-volatile memory for use by the software application as storage, the second physical address locations mutually exclusive to the first physical address locations;
   generating a remap table to map a logical address space for the software application to pointers to the first physical address locations;
   granting the software application direct access, via the remap table, to the first physical address locations;
   receiving a request by the software application to copy data at one of the second physical address locations to one or more of the first physical address locations; and
   updating an existing entry in the remap table with a new pointer to indicate the one of the second physical address locations is to be utilized as one of the first physical address locations such that the request is fulfilled without making a copy of the data.

2. The method of claim 1, comprising the byte-addressable, non-volatile memory including storage class memory (SCM), phase change memory (PCM), phase change memory and switch (PCMS), ferromagnetic memory, magnetoresistive memory, magnetic memory, magnetic random access memory (MRAM) or semiconductor-oxide-nitride-oxide-semiconductor (SONOS) memory.

3. The method of claim 1, comprising the remap table maintained in a volatile memory.

4. The method of claim 1, comprising the byte-addressable non-volatile memory is recognized by the software application as directly addressable memory.

5. An apparatus comprising:
   an operating system that includes processing logic, at least a portion of which is executed in hardware, the processing logic to;
   allocate first physical address locations of a byte-addressable, non-volatile memory for use by a software application as a random access memory (RAM) disk;
   allocate second physical address locations within the byte-addressable, non-volatile memory for use by the software application as storage, the second physical address locations mutually exclusive to the first physical address locations;
   generate a remap table to map a logical address space for the software application to pointers to the first physical address locations;
   grant the software application direct access, via the remap table, to the first physical address locations;
   receive a request by the software application to copy data at one of the second physical address locations to one or more of the first physical address locations; and
   update an existing entry in the remap table with a new pointer to indicate the one of the second physical address locations is to be utilized as one of the first physical address locations such that the request is fulfilled without making a copy of the data.

6. The apparatus of claim 5, comprising the byte-addressable, non-volatile memory including storage class memory (SCM), phase change memory (PCM), phase change memory and switch (PCMS), ferromagnetic memory, magnetoresistive memory, magnetic memory, magnetic random access memory (MRAM) or semiconductor-oxide-nitride-oxide-semiconductor (SONOS) memory.

7. The apparatus of claim 5, comprising the remap table maintained in a volatile memory.

8. The apparatus of claim 5, comprising the byte-addressable non-volatile memory is recognized by the software application or the processing logic as directly addressable memory.

9. A system comprising:
   a processor for a computing system;
   a byte-addressable, non-volatile memory coupled with the processor via a memory bus; and
   an operating system for the computing system, the operating system to:
   allocate first physical address locations of the byte-addressable, non-volatile memory for use by a software application as a random access memory (RAM) disk;
   allocate second physical address locations within the byte-addressable, non-volatile memory for use by the software application as storage, the second physical address locations mutually exclusive to the first physical address locations;
   generate a remap table to map a logical address space for the software application to pointers to the first physical address locations;
   grant the software application direct access, via the remap table, to the first physical address locations;
   receive a request by the software application to copy data at one of the second physical address locations to one or more of the first physical address locations; and
   update an existing entry in the remap table with a new pointer to indicate the one of the second physical address locations is to be utilized as one of the first physical address locations such that the request is fulfilled without making a copy of the data.

10. The system of claim 9, comprising the byte-addressable, non-volatile memory including storage class memory (SCM), phase change memory (PCM), phase change memory and switch (PCMS), ferromagnetic memory, magnetoresistive memory, magnetic memory, magnetic random access memory (MRAM) or semiconductor-oxide-nitride-oxide-semiconductor (SONOS) memory.

11. The system of claim 9, further comprising:
a volatile memory that includes dynamic random access memory (DRAM) or static random access memory (SRAM), wherein the remap table is maintained in the volatile memory.

12. The system of claim 9, comprising the byte-addressable non-volatile memory is recognized by the software application or the operating system as directly addressable memory.

13. At least one machine non-transitory readable medium comprising a plurality of instructions that in response to being executed by a system at a computing device cause the system to:
allocate first physical address locations of a byte-addressable, non-volatile memory for use by a software application running at the computing device as a random access memory (RAM) disk;
allocate second physical address locations within the byte-addressable, non-volatile memory for use by the software application as storage, the second physical address locations mutually exclusive to the first physical address locations;
generate a remap table to map a logical address space for the software application to pointers to the first physical address locations;
grant the software application direct access, via the remap table, to the first physical address locations;
receive a request by the software application to copy data at one of the second physical address locations to one or more of the first physical address locations; and
update an existing entry in the remap table with a new pointer to indicate the one of the second physical address locations is to be utilized as one of the first physical address locations such that the request is fulfilled without making a copy of the data.

14. The at least one machine non-transitory readable medium of claim 13, comprising the byte-addressable, non-volatile memory including storage class memory (SCM), phase change memory (PCM), phase change memory and switch (PCMS), ferromagnetic memory, magnetoresistive memory, magnetic memory, magnetic random access memory (MRAM) or semiconductor-oxide-nitride-oxide-semiconductor (SONOS) memory.

15. The at least one machine non-transitory readable medium of claim 13, comprising the remap table maintained in a volatile memory.

16. The at least one machine non-transitory readable medium of claim 13, comprising the byte-addressable non-volatile memory is recognized by the software application as directly addressable memory.

* * * * *